(12) United States Patent
Hwang et al.

(10) Patent No.: US 11,197,366 B2
(45) Date of Patent: Dec. 7, 2021

(54) ELECTROMAGNETIC BAND GAP STRUCTUTRE FOR ANTENNA ARRAY

(71) Applicant: Delta Electronics, Inc., Taoyuan (TW)

(72) Inventors: Chieh-Tsao Hwang, Taoyuan (TW); Yen-Ting Chen, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/568,867

(22) Filed: Sep. 12, 2019

(65) Prior Publication Data
US 2021/0029821 A1 Jan. 28, 2021

(30) Foreign Application Priority Data

Jul. 24, 2019 (CN) .......................... 201910671907.3

(51) Int. Cl.
| | |
|---|---|
| *H05K 1/02* | (2006.01) |
| *H01P 1/20* | (2006.01) |
| *H01Q 1/48* | (2006.01) |
| *H01Q 1/52* | (2006.01) |
| *H01Q 15/00* | (2006.01) |
| *H01Q 21/28* | (2006.01) |

(52) U.S. Cl.
CPC ......... *H05K 1/0236* (2013.01); *H01P 1/2005* (2013.01); *H01Q 1/48* (2013.01); *H01Q 1/523* (2013.01); *H01Q 15/008* (2013.01); *H01Q 21/28* (2013.01)

(58) Field of Classification Search
CPC ...... H05K 1/0236; H01P 1/2005; H01Q 1/48; H01Q 1/528; H01Q 1/008; H01Q 21/2128
See application file for complete search history.

(56) References Cited

U.S. PATENT DOCUMENTS

| | | | |
|---|---|---|---|
| 4,353,067 A | 10/1982 | Mims | |
| 5,283,587 A | 2/1994 | Hirshfield et al. | |
| 6,501,436 B1 * | 12/2002 | Saito | H01Q 9/26 343/742 |
| 7,498,989 B1 | 3/2009 | Volman | |
| 10,014,572 B2 | 7/2018 | Tagi et al. | |

(Continued)

FOREIGN PATENT DOCUMENTS

| | | |
|---|---|---|
| CN | 102823062 A | 12/2012 |
| CN | 104157982 A | 11/2014 |

(Continued)

OTHER PUBLICATIONS

The Office Action of its corresponding TW application No. 108126078 dated Mar. 17, 2020.

(Continued)

*Primary Examiner* — Ankur Jain
*Assistant Examiner* — Angelica M Perez
(74) *Attorney, Agent, or Firm* — Muncy, Geissler, Olds & Lowe, P.C.

(57) ABSTRACT

A communication device includes a ground plane, an antenna array, and an EBG (Electromagnetic Band Gap) structure. The antenna array includes a plurality of antenna elements. The EBG structure includes a plurality of EBG units. The EBG units are coupled to the ground plane. The antenna array is surrounded by the EBG structure. The EBG structure is configured to suppress the front-to-back ratio of the radiation efficiency of the antenna array.

17 Claims, 4 Drawing Sheets

(56) References Cited

U.S. PATENT DOCUMENTS

| | | | |
|---|---|---|---|
| 10,326,196 B2* | 6/2019 | Kim | H01Q 1/243 |
| 2003/0011522 A1 | 1/2003 | Mckinzie, III et al. | |
| 2003/0090433 A1 | 5/2003 | Ohtsuka et al. | |
| 2005/0162326 A1 | 7/2005 | Steyn et al. | |
| 2006/0132375 A1 | 6/2006 | Kim et al. | |
| 2014/0028524 A1* | 1/2014 | Jerauld | H01Q 1/52 343/893 |
| 2014/0049437 A1* | 2/2014 | Hung | H01Q 21/28 343/841 |
| 2014/0354513 A1* | 12/2014 | Nair | H01Q 9/0457 264/400 |
| 2015/0035714 A1* | 2/2015 | Zhou | H01Q 13/106 343/767 |
| 2016/0028161 A1* | 1/2016 | Kawaguchi | H01Q 1/32 343/700 MS |
| 2016/0282462 A1 | 9/2016 | Pitts et al. | |
| 2018/0241135 A1 | 8/2018 | Furlan et al. | |
| 2018/0241442 A1* | 8/2018 | Zirwas | H04B 7/0617 |
| 2019/0051977 A1* | 2/2019 | Kawaguchi | H01Q 21/06 |
| 2019/0089069 A1* | 3/2019 | Niroo | H01Q 21/22 |
| 2019/0098750 A1* | 3/2019 | Woo | H01Q 9/0457 |
| 2019/0229398 A1* | 7/2019 | Ryoo | H01Q 1/243 |
| 2020/0106188 A1* | 4/2020 | Ou | H01Q 21/065 |

FOREIGN PATENT DOCUMENTS

| | | |
|---|---|---|
| CN | 207732097 U | 8/2018 |
| CN | 207732097 U | 8/2018 |
| CN | 106129638 B | 6/2019 |
| CN | 109904605 A | 6/2019 |
| DE | 102016014385 A1 | 6/2018 |
| DE | 112017000954 T5 | 11/2018 |
| DE | 112017001941 T5 | 1/2019 |
| JP | H-0591019 U | 12/1993 |
| JP | H-07235828 A | 9/1995 |
| JP | 2007142878 A | 6/2007 |
| JP | 2008283381 A | 11/2008 |
| JP | 2014039245 A | 2/2014 |
| JP | 2014179680 A | 9/2014 |
| TW | I631769 | 8/2018 |

OTHER PUBLICATIONS

The Office Action of its related TW application No. 108126077 dated Mar. 19, 2020.
The Search Report of its corresponding EP application No. 19206962.3 dated May 18, 2020.
The Search Report of its related EP application No. 19203100.3 dated May 8, 2020.
Taiwanese Office Action of its corresponding to application No. 108126078 dated Sep. 24, 2020; pp. 1-5.
Office Action dated Feb. 9, 2021 in JP Application No. 2019-221884, 8 pages.
Office Action dated Mar. 23, 2021 in JP Application No. 2020-008378, 3 pages.
Office Action dated Mar. 10, 2021 in U.S. Appl. No. 16/904,521, 26 pages.
Office Action dated Jan. 13, 2021 in U.S. Appl. No. 16/579,688, 8 pages.
Tsai et al., "A Low-Cost Efficient Antenna Array for Wireless Local-Loop Systems," 2000 IEEE-APS Conference on Antennas and Propagation Wireless Communications, 6 pages.
Extended Search Report of related EP Application No. 20186251.3, dated Nov. 25, 2020, 10 pages.
Office Action JP application No. 2020-126484 dated Jul. 13, 2021.

* cited by examiner

ELECTROMAGNETIC BAND GAP STRUCTUTRE FOR ANTENNA ARRAY

CROSS REFERENCE TO RELATED APPLICATIONS

This application claims priority of China Patent Application No. 201910671907.3 filed on Jul. 24, 2019, the entirety of which is incorporated by reference herein.

BACKGROUND OF THE INVENTION

Field of the Invention

The disclosure generally relates to a communication device, and more particularly, it relates to a communication device for reducing the front-to-back ratio of the radiation pattern of an antenna array.

Description of the Related Art

With the advancements being made in mobile communication technology, mobile devices such as portable computers, mobile phones, multimedia players, and other hybrid functional portable electronic devices have become more common. To satisfy user demand, mobile devices can usually perform wireless communication functions. Some devices cover a large wireless communication area; these include mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, 2500 MHz, and 2700 MHz. Some devices cover a small wireless communication area; these include mobile phones using Wi-Fi and Bluetooth systems and using frequency bands of 2.4 GHz, 5.2 GHz, and 5.8 GHz.

Antennas are indispensable elements for mobile devices to connect to the Internet at a high speed. Entering the next communication generation, 5G antenna arrays often have two problems, one of which is related to shorter communication distances, and the other of which is related to poor spatial efficiency. These problems result from the isolation between antenna elements being too low and the front-to-back ratio of antenna arrays being too high. Accordingly, there is a need to propose a novel solution for solving the problems of the prior art.

BRIEF SUMMARY OF THE INVENTION

In an exemplary embodiment, the disclosure is directed to a communication device which includes a ground plane, an antenna array, and an EBG (Electromagnetic Band Gap) structure. The antenna array includes a plurality of antenna elements. The EBG structure includes a plurality of EBG units. The EBG units are coupled to the ground plane. The antenna array is surrounded by the EBG structure.

In some embodiments, the EBG structure is configured to suppress the front-to-back ratio of the radiation pattern of the antenna array.

In some embodiments, the antenna array covers an operation frequency band from 27 GHz to 29 GHz.

In some embodiments, the antenna elements are arranged to form a first symmetrical pattern.

In some embodiments, the first symmetrical pattern substantially has a square shape.

In some embodiments, each of the antenna elements is a patch antenna.

In some embodiments, the length of each of the antenna elements is substantially equal to 0.25 wavelength of the operation frequency band.

In some embodiments, the distance between any adjacent two of the antenna elements is substantially equal to 0.5 wavelength of the operation frequency band.

In some embodiments, the total number of antenna elements is 16.

In some embodiments, the EBG units are arranged to form a second symmetrical pattern.

In some embodiments, the second symmetrical pattern substantially has a hollow square shape.

In some embodiments, the second symmetrical pattern includes a first loop shape and a second loop shape. The second loop shape is positioned inside the first loop shape. The antenna elements are positioned inside the second loop shape.

In some embodiments, each of the EBG units substantially has a mushroom shape.

In some embodiments, each of the EBG units includes a top metal piece and a connection metal pillar. The top metal piece is coupled through the connection metal pillar to the ground plane.

In some embodiments, the length of each of the EBG units is shorter than 0.1 wavelength of the operation frequency band.

In some embodiments, the height of each of the EBG units is shorter than 0.1 wavelength of the operation frequency band.

In some embodiments, the distance between any adjacent two of the EBG units is shorter than 0.02 wavelength of the operation frequency band.

In some embodiments, the shortest distance from any of the antenna elements to the EBG structure is longer than 0.25 wavelength of the operation frequency band.

In some embodiments, the total number of EBG units is 184.

In some embodiments, the communication device further includes a dielectric substrate disposed on the ground plane. The EBG units penetrate the dielectric substrate.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range. One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

Figure 1:
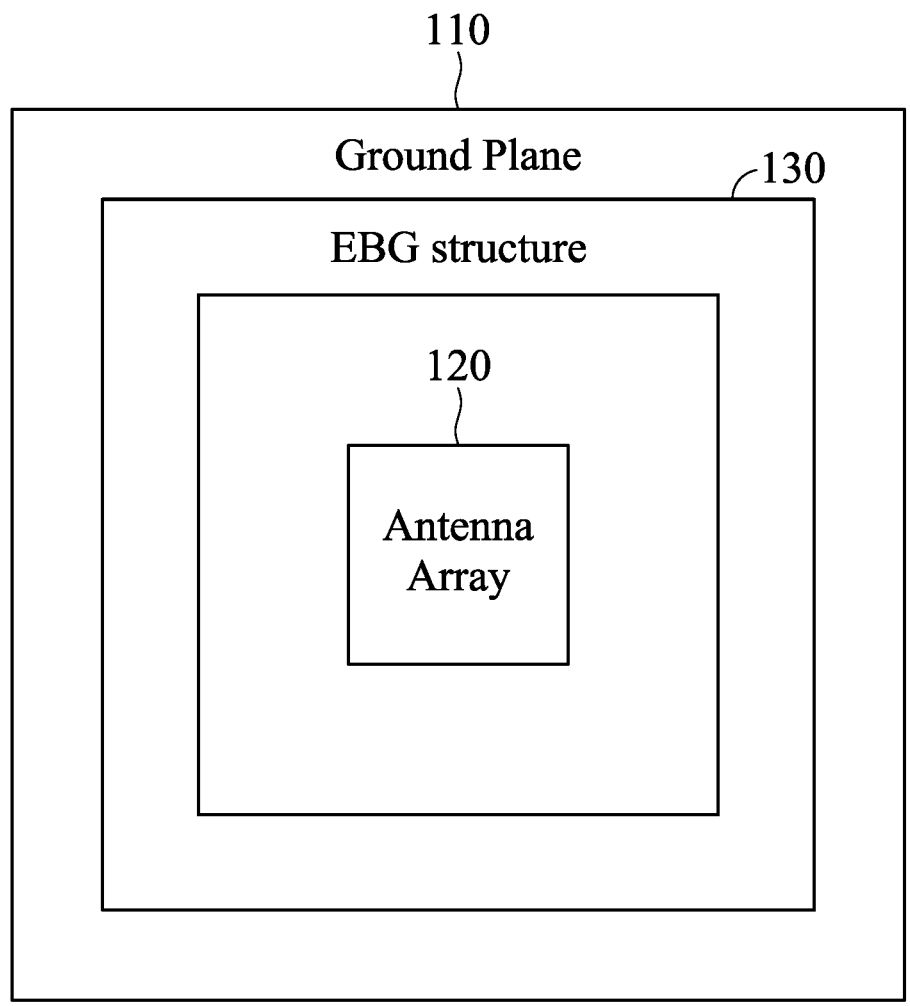
FIG. 1 is a diagram of a communication device according to an embodiment of the invention.

FIG. 1 is a diagram of a communication device 100 according to an embodiment of the invention. As shown in FIG. 1, the communication device 100 includes a ground plane 110, an antenna array 120, and an EBG (Electromagnetic Band Gap) structure 130, which may all be made of metal materials. The antenna array 120 includes a plurality of antenna elements (not shown). The shapes and types of the antenna elements are not limited in the invention. For example, each antenna element may be a patch antenna, a monopole antenna, a dipole antenna, a bowtie antenna, a loop antenna, a helical antenna, or a chip antenna, but it is not limited thereto. The EBG structure 130 includes a plurality of EBG units (not shown). The EBG units may all be coupled to the ground plane 110. The shapes and types of the EBG units are not limited in the invention. It should be noted that the antenna array 120 is completely surrounded by the EBG structure 130. With such a design, the EBG structure 130 is configured to suppress the front-to-back ratio of the radiation pattern of the antenna array 120, thereby effectively increasing the communication distance and the spatial efficiency of the communication device 100. In addition, the communication device 100 may further include other components, such as a processor, a power supply module, and/or a housing, although they are not displayed in FIG. 1.

The following embodiments will introduce the detailed structure and physical implementation of the communication device 100. It should be understood that these figures and descriptions are merely exemplary, rather than limitations of the invention.

Figure 2:
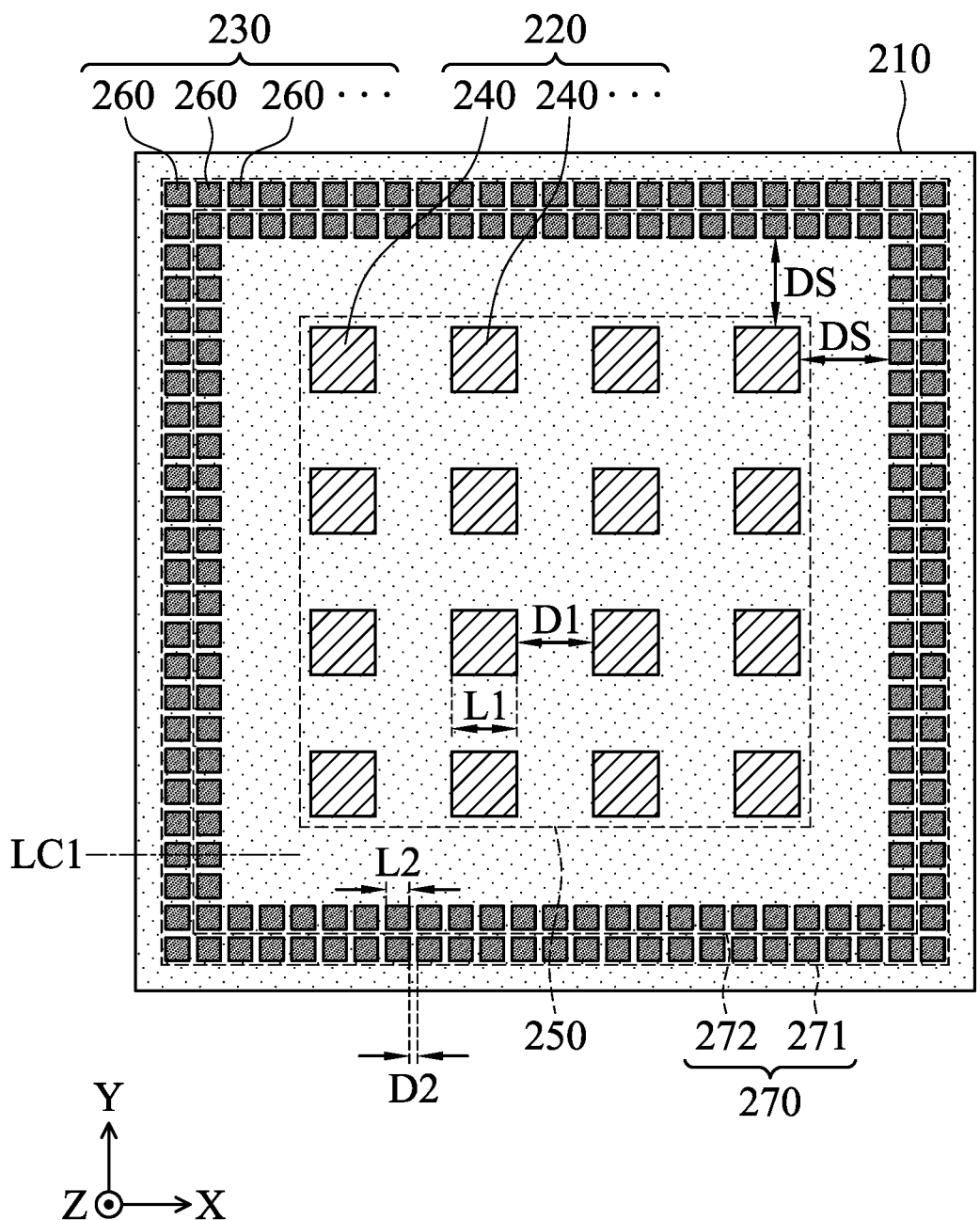
FIG. 2 is a top view of a communication device according to an embodiment of the invention.

FIG. 2 is a top view of a communication device 200 according to an embodiment of the invention. In the embodiment of FIG. 2, the communication device 200 includes a ground plane 210, an antenna array 220, and an EBG structure 230, which may all be made of metal materials. The antenna array 220 includes a plurality of antenna elements 240. For example, each of the antenna elements 240 may be a patch antenna. The antenna elements 240 may be arranged to form a first symmetrical pattern 250. For example, the first symmetrical pattern 250 may substantially have a square shape. In some embodiments, the total number of antenna elements 240 is 16, thereby forming a 4-by-4 square matrix. In alternative embodiments, the total number of antenna elements 240 may be adjusted to meet requirements.

The EBG structure 230 includes a plurality of EBG units 260. The EBG units 260 may all be coupled to the ground plane 210. For example, each of the EBG units 260 may substantially have a mushroom shape. The EBG units 260 may be arranged to form a second symmetrical pattern 270. For example, the second symmetrical pattern 270 may substantially have a hollow square shape. Specifically, the second symmetrical pattern 270 includes a first loop shape 271 and a second loop shape 272. The second loop shape 272 is positioned inside the first loop shape 271. The antenna elements 240 of the antenna array 220 are all positioned inside the second loop shape 272. According to practical measurements, the dual-loop arrangement of EBG units 260 is used as a band rejection filter for effectively blocking surface waves in a target band. In some embodiments, the total number of EBG units 260 is 184. In alternative embodiments, the total number of EBG units 260 may be adjusted to meet requirements.

Figure 3:
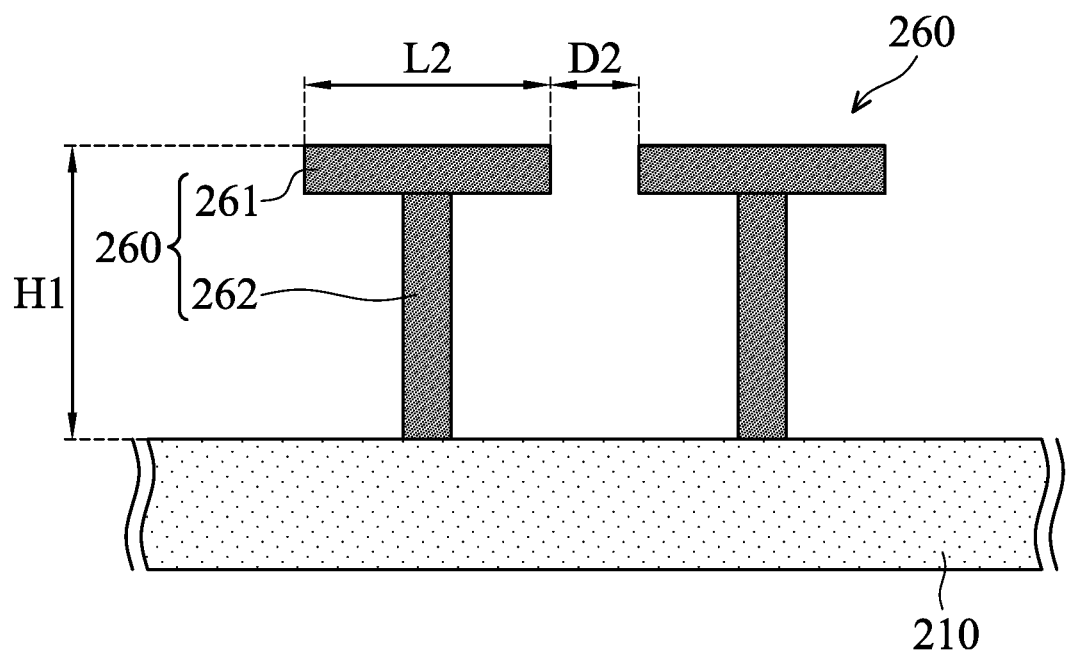
FIG. 3 is a partial sectional view of a communication device according to an embodiment of the invention.

FIG. 3 is a partial sectional view of the communication device 200 according to an embodiment of the invention (along a sectional line LC1 of FIG. 2). In the embodiment of FIG. 3, each of the EBG units 260 includes a top metal piece 261 and a connection metal pillar 262. The top metal piece 261 is coupled through the connection metal pillar 262 to the ground plane 210. For example, the top metal piece 260 may substantially have a relatively small square shape, and it may be substantially parallel to the ground plane 210; the connection metal pillar 262 may substantially have a cylindrical shape, and it may be substantially perpendicular to the ground plane 210 and the top metal piece 261. However, the invention is not limited thereto. In other embodiments, adjustments are made such that the top metal piece 261 has a regular triangular shape, a circular shape, an elliptical shape, or a trapezoidal shape, and the connection metal pillar 262 has a triangular-column shape or a square-column shape.

In some embodiments, the antenna array 220 covers an operation frequency band from 27 GHz to 29 GHz, so as to support the wideband operation of 5G millimeter-wave systems. With respect to the operation principles, the target band of the band rejection filter, formed by the EBG units 260, can be the same as the operation frequency band of the antenna array 220, so as to avoid the unwanted diffusion of surface waves. Thus, the EBG structure 230 is configured to suppress the front-to-back ratio of the radiation pattern of the antenna array 220, thereby effectively increasing the communicate distance and the spatial efficiency of the communicate device 200. According to practical measurements, after the surrounding design of the EBG structure 230 is applied, the front-to-back ratio of the radiation pattern of the antenna array 220 is reduced by about 6 dB to 8 dB, and it can meet the requirement of practical application of general communication devices.

In some embodiments, the element sizes of the communication device 200 are described as follows. The length L1 of each of the antenna elements 240 may be substantially equal to 0.25 wavelength ($\lambda/4$) of the operation frequency band of the antenna array 220. The distance D1 between any two adjacent antenna elements 240 may be substantially equal to 0.5 wavelength ($\lambda/2$) of the operation frequency band of the antenna array 220. The length L2 of each of the EBG units 260 (or the length L2 of the top metal piece 261) may be shorter than 0.1 wavelength ($\lambda/10$) of the operation frequency band of the antenna array 220. The height H1 of each of the EBG units 260 (or the height H1 of the top metal piece 261) may be shorter than 0.1 wavelength ($\lambda/10$) of the operation frequency band of the antenna array 220. The distance D2 between any two adjacent EBG units 260 may be shorter than 0.02 wavelength ($\lambda/50$) of the operation frequency band of the antenna array 220. The shortest distance DS from any of the antenna elements 240 to the EBG structure 230 may be longer than 0.25 wavelength ($\lambda/4$) of the operation frequency band of the antenna array 220. The above ranges of distances are calculated and obtained according to many experiment results, and they help to minimize the front-to-back ratio of the radiation pattern of the antenna array 220, and maximize the communication distance and spatial efficiency of the communication device 200.

Figure 4:
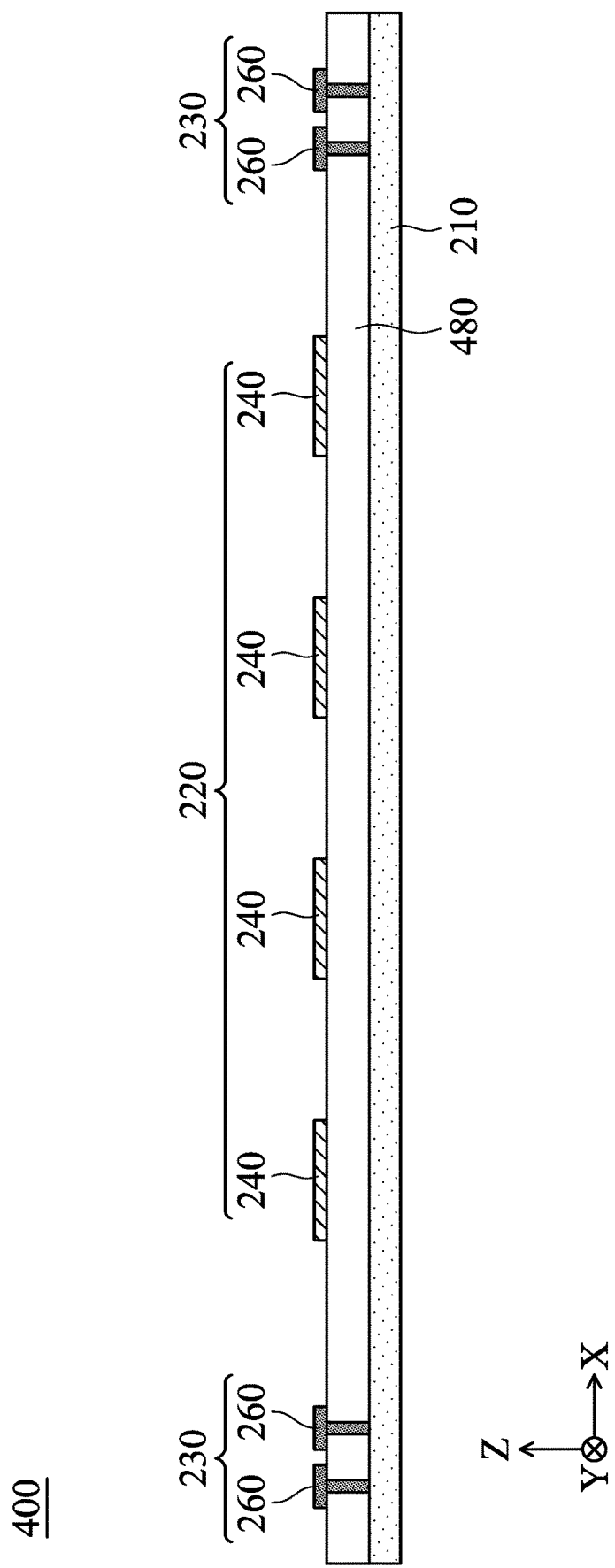
FIG. 4 is a sectional view of a communication device according to an embodiment of the invention.

FIG. 4 is a sectional view of a communication device 400 according to an embodiment of the invention. FIG. 4 is similar to FIG. 2 and FIG. 3. In the embodiment of FIG. 4, the communication device 400 further includes a dielectric substrate 480. The dielectric substrate 480 is disposed on the ground plane 210. The antenna elements 240 of the antenna array 220 may all be disposed on the dielectric substrate 480. The EBG units 260 of the EBG structure 230 may all penetrate the dielectric substrate 480. In some embodiments, the dielectric constant of the dielectric substrate 480 is from 2 to 6. It should be noted that if the dielectric substrate 480 is applied, the aforementioned relationship between the element sizes and the corresponding wavelengths may be adjusted according to the dielectric constant of the dielectric substrate 480, thereby minimizing the total size of the communication device 400. Other features of the communication device 400 of FIG. 4 are similar to those of the communication device 200 of FIG. 2 and FIG. 3. Accordingly, the two embodiments can achieve similar levels of performance.

The invention proposes a novel communication device, which includes an EBG structure surrounding an antenna array. In comparison to conventional designs, the invention has at least the advantages of suppressing the front-to-back ratio of the radiation pattern of the antenna array, and therefore it is suitable for application in a variety of communication devices, so as to improve the communication distance and the spatial efficiency.

Note that the above element sizes, element shapes, and frequency ranges are not limitations of the invention. An antenna designer can fine-tune these settings or values to meet different requirements. It should be understood that the communication device of the invention is not limited to the configurations of FIGS. 1-4. The invention may merely include any one or more features of any one or more embodiments of FIGS. 1-4. In other words, not all of the features displayed in the figures should be implemented in the communication device of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A communication device, comprising:
   a ground plane;
   an antenna array, comprising a plurality of antenna elements; and
   an EBG (Electromagnetic Band Gap) structure, comprising a plurality of EBG units formed as a rectangular shape, wherein the EBG units are coupled to the ground plane;
   wherein the antenna array as a whole is surrounded and enclosed by the EBG structure, and the EBG structure is provided without going through any two individual antenna elements;
   wherein the antenna elements are arranged to form a first symmetrical pattern;
   wherein the first symmetrical pattern has a rectangular shape;
   wherein the EBG units are arranged to form the EGB structure with the first symmetrical pattern;
   wherein a shortest distance between an outside boundary of the antenna array and an inside boundary of the EBG structure is longer than 0.25 wavelength of an operation frequency band of the antenna array.

2. The communication device as claimed in claim 1, wherein the EBG structure is configured to suppress a front-to-back ratio of a radiation pattern of the antenna array.

3. The communication device as claimed in claim 1, wherein the operation frequency band is from 27 GHz to 29 GHz.

4. The communication device as claimed in claim 3, wherein a length of each of the antenna elements is equal to 0.25 wavelength of the operation frequency band.

5. The communication device as claimed in claim 3, wherein a distance between any adjacent two of the antenna elements is equal to 0.5 wavelength of the operation frequency band.

6. The communication device as claimed in claim 3, wherein a length of each of the EBG units is shorter than 0.1 wavelength of the operation frequency band.

7. The communication device as claimed in claim 3, wherein a height of each of the EBG units is shorter than 0.1 wavelength of the operation frequency band.

8. The communication device as claimed in claim 3, wherein a distance between any adjacent two of the EBG units is shorter than 0.02 wavelength of the operation frequency band.

9. The communication device as claimed in claim 1, wherein each of the antenna elements is a patch antenna.

10. The communication device as claimed in claim 1, wherein a total number of antenna elements is 16.

11. The communication device as claimed in claim 1, wherein the EBG units are arranged to form a second symmetrical pattern.

12. The communication device as claimed in claim 11, wherein the second symmetrical pattern has a hollow square shape.

13. The communication device as claimed in claim 11, wherein the second symmetrical pattern comprises a first loop shape and a second loop shape, the second loop shape is positioned inside the first loop shape, and the antenna elements are positioned inside the second loop shape.

14. The communication device as claimed in claim 1, wherein each of the EBG units has a mushroom shape.

15. The communication device as claimed in claim 1, wherein each of the EBG units comprises a top metal piece and a connection metal pillar, and the top metal piece is coupled through the connection metal pillar to the ground plane.

16. The communication device as claimed in claim 1, wherein a total number of EBG units is 184.

17. The communication device as claimed in claim 1, further comprising:
   a dielectric substrate, disposed on the ground plane, wherein the EBG units penetrate the dielectric substrate.

* * * * *